US007577188B1

(12) United States Patent
Lewis

(10) Patent No.: US 7,577,188 B1
(45) Date of Patent: Aug. 18, 2009

(54) PHYSICAL LAYER AND MAC ENHANCEMENTS USING COMPLEX SEQUENCES ON A WIRELESS CHANNEL

(75) Inventor: Michael Lewis, Akron, OH (US)

(73) Assignee: Cisco Technology, Inc., San Jose, CA (US)

( * ) Notice: Subject to any disclaimer, the term of this patent is extended or adjusted under 35 U.S.C. 154(b) by 1530 days.

(21) Appl. No.: 09/952,368

(22) Filed: Sep. 13, 2001

(51) Int. Cl.
H04B 1/00 (2006.01)
H03D 1/00 (2006.01)
(52) U.S. Cl. .................. 375/150; 375/343; 375/142
(58) Field of Classification Search ............. 375/261, 375/358, 367, 140, 142, 148, 149, 150, 152, 375/316, 343, 340, 147, 354, 130; 370/335, 370/342, 350, 337, 389, 351, 464, 498, 503, 370/509, 441; 708/3, 5, 422, 200, 425, 426, 708/511, 813, 801; 704/216–218
See application file for complete search history.

(56) References Cited

U.S. PATENT DOCUMENTS

| | | | | |
|---|---|---|---|---|
| 3,808,365 A * | 4/1974 | Ehrat | | 178/22 |
| 4,025,772 A * | 5/1977 | Constant | | 708/420 |
| 4,965,759 A * | 10/1990 | Uchida et al. | | 708/5 |
| 5,084,891 A * | 1/1992 | Ariyavisitakul et al. | | 371/42 |
| 5,132,986 A * | 7/1992 | Endo et al. | | 375/142 |
| 5,260,972 A * | 11/1993 | Wang | | 375/285 |
| 5,488,629 A * | 1/1996 | Takahashi et al. | | 375/150 |
| 5,563,819 A * | 10/1996 | Nelson | | 364/825 |
| 5,608,764 A | 3/1997 | Sugita et al. | | |
| 5,652,764 A * | 7/1997 | Kanzaki et al. | | 375/200 |
| 5,659,574 A * | 8/1997 | Durrant et al. | | 375/150 |
| 5,666,379 A * | 9/1997 | Ovard et al. | | 375/239 |
| 5,675,616 A * | 10/1997 | Hulbert et al. | | 375/355 |
| 5,737,326 A * | 4/1998 | I et al. | | 370/335 |
| 5,793,907 A * | 8/1998 | Jalali et al. | | 385/24 |
| 6,055,265 A * | 4/2000 | Kim | | 375/150 |
| 6,091,954 A * | 7/2000 | Haartsen et al. | | 455/447 |
| 6,097,712 A * | 8/2000 | Secord et al. | | 370/335 |
| 6,125,124 A | 9/2000 | Junell et al. | | |
| 6,134,569 A * | 10/2000 | Kot | | 708/3 |
| 6,160,758 A | 12/2000 | Spiesberger | | |
| 6,226,337 B1 | 5/2001 | Klank et al. | | |
| 6,289,064 B1 * | 9/2001 | Hiramatsu et al. | | 375/365 |
| 6,377,782 B1 * | 4/2002 | Bishop et al. | | 455/3.01 |
| 6,438,183 B1 * | 8/2002 | Taura et al. | | 375/343 |
| 6,504,498 B1 * | 1/2003 | O'Brien | | 341/143 |
| 6,556,620 B1 * | 4/2003 | Ohnishi | | 375/149 |
| 6,570,857 B1 * | 5/2003 | Haartsen et al. | | 370/312 |
| 6,650,693 B1 * | 11/2003 | Park et al. | | 375/149 |
| 6,721,365 B1 * | 4/2004 | Yin et al. | | 375/261 |
| 6,727,790 B2 * | 4/2004 | Raphaeli et al. | | 335/363 |
| 2001/0014086 A1* | 8/2001 | Jeong et al. | | 370/335 |
| 2002/0047923 A1* | 4/2002 | Okuno et al. | | 348/540 |
| 2003/0018558 A1* | 1/2003 | Heffner et al. | | 705/37 |

(Continued)

*Primary Examiner*—Tesfaldet Bocure
*Assistant Examiner*—Vineeta S Panwalkar
(74) *Attorney, Agent, or Firm*—Tucker Ellis & West LLP

(57) ABSTRACT

A method and apparatus to enable physical layer MAC layer enhancements while at the same time allowing complete backward compatibility with existing protocols. The method and apparatus determine on a packet by packet basis if a transmission originated from a standard or enhanced node by correlating each packet with a known sequence during the synchronization preamble, before any header or data arrive.

14 Claims, 5 Drawing Sheets

U.S. PATENT DOCUMENTS

| | | | |
|---|---|---|---|
| 2003/0043947 A1* | 3/2003 | Zehavi et al. | 375/365 |
| 2004/0009749 A1* | 1/2004 | Arazi et al. | 455/41.2 |
| 2004/0161113 A1* | 8/2004 | Coene et al. | 380/287 |

* cited by examiner

PHYSICAL LAYER AND MAC ENHANCEMENTS USING COMPLEX SEQUENCES ON A WIRELESS CHANNEL

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A "MICROFICHE APPENDIX"

Not applicable.

BACKGROUND OF THE INVENTION (1) Field of the Invention

The present invention relates in general to communications systems and in particular to wireless communications systems having existing protocols.

(2) Description of the Related Art Including Information Disclosed Under 37 CFR 1.97 and 37 CFR 1.98

In the communications industry, and in particular the wireless communication industry, various protocols such as IEEE 802.11, 802.11a and 802.11b exist to enable products from various manufacturers to be use and share communication channels and to communicate with each other.

Because such a broad range of vendors uses these standards, they are often very general and lacking in features and functionality. A vendor who desires to add certain functions to a wireless apparatus, such as QoS, improved synchronization, more advanced forward error correction, or other physical layer and MAC layer enhancements runs the risk of becoming incompatible with the standard and thus excluded from the market. Therefore, a need exists for a method that enables physical layer and MAC layer enhancements while at the same time allowing complete backward compatibility with existing protocols.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of instrumentalities and combinations particularly pointed out in the appended claims.

BRIEF SUMMARY OF THE INVENTION

In view of the aforementioned needs, the invention contemplates a method and apparatus that enables physical layer and MAC layer enhancements while at the same time having complete backward compatibility.

The present invention contemplates a method that determines on a packet by packet basis if a transmission originated from an enhanced node during the synchronization preamble. The receiver receives an analog signal. In a preferred embodiment, the analog signal is comprised of a complex time sequence generated by the transmitter. The signal is then converted from an analog signal to a digital packet. The correlation of the packet with a known sequence is then determined. An output is then produced which is indicative of the correlation of the digital packet with the known sequence.

Additionally, the present invention contemplates an apparatus for carrying out the steps required for the aforementioned method. The apparatus is comprised of a memory that stores a known sequence. The apparatus is further comprised of a receiver that receives the signal from the source. An analog to digital converter connected to the receiver converts the signal into digital packets. The digital packets are then input into a shift register. A plurality of multipliers, having one input connected to the shift register and another input connected to the memory with the known sequence are connected so that each discrete unit of the shift register is multiplied with the corresponding discrete unit of the memory. A summer receives the outputs of the multipliers and produces an output, which indicates whether a correlation has been found between the digital packet and the known sequence stored in memory.

In the preferred embodiment, complex (i.e. I/Q) sequences are utilized. This is because complex sequences, generated in the manner described below, have excellent auto- and cross-correlation properties. These properties may be optimized by selecting an appropriate pseudo-random sequence.

The present invention enables the redefinition and extension of headers to incorporate enhanced protocol features. The present invention may also facilitate enhanced QoS features as well as enabling complete redefinition of the MAC layer protocol beyond protocol enhancements. Furthermore, the present invention may be utilized for improved synchronization of the receiver to the transmitted data. The present invention may also enable more advanced forward error correction. In general one may completely redefine the physical and MAC layer network protocols and yet remain completely compatible with an existing standard on a packet by packet basis.

Among those benefits and improvements that have been disclosed, other objects and advantages of this invention will become apparent from the following description taken in conjunction with the accompanying drawings. The drawings constitute a part of this specification and include exemplary embodiments of the present invention and illustrate various objects and features thereof.

BRIEF DESCRIPTION OF THE SEVERAL VIEWS OF THE DRAWING

The drawings illustrate the best mode presently contemplated of carrying out the invention.

This the drawings.

DETAILED DESCRIPTION OF INVENTION

Figure 1:
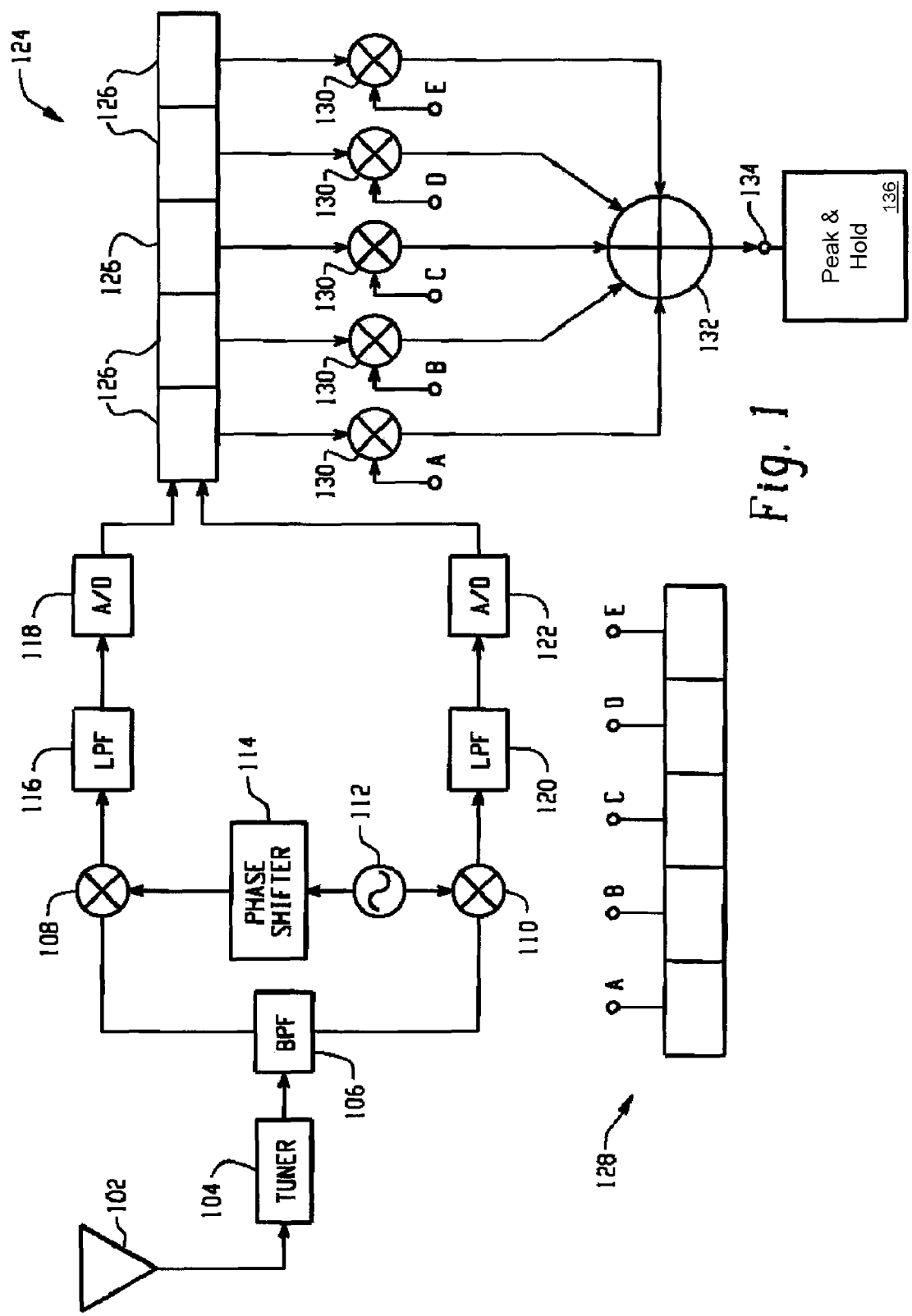
FIG. 1 is a block diagram of the components of the preferred embodiment of the present invention.

Complex (I/Q) time sequences generated from the inverse Fourier transform (IFFT) of a complex frequency space having a constant modulus, for example $|F(\omega)|=$constant, have excellent auto-correlation and cross-correlation properties. If the inverse Fourier transform is defined as $$f(t) = \int_{-\infty}^{\infty} F(\omega)e^{-i\alpha x} d\omega \qquad (1)$$

then the autocorrelation function of $f(t)$ is given by $$A(\tau) = \int_{-\infty}^{\infty} f(t)f^*(t-\tau)dt \qquad (2)$$

$$= \int_{-\infty}^{\infty} dt \left\{ \left( \int_{-\infty}^{\infty} F(\omega)e^{-i\omega t} d\omega \right) \left( \int_{-\infty}^{\infty} F^*(\omega')e^{i\omega'(t-\tau)} d\omega' \right) \right\}$$

Rearranging the terms of (2) yields $$A(\tau) = \int_{-\infty}^{\infty} d\omega \int_{-\infty}^{\infty} d\omega' F(\omega)F^*(\omega')e^{-i\omega\tau} \int_{-\infty}^{\infty} dt e^{-i(\omega'-\omega)t} \qquad (3)$$

Recognizing that the Dirac-delta function in (3) above as $$\delta(\omega'-\omega) = \frac{1}{2\pi} \int_{-\infty}^{\infty} dt e^{-i(\omega'-\omega)t} \qquad (4)$$

equation (3) can be simplified to $$A(\tau) = 2\pi \int_{-\infty}^{\infty} d\omega \int_{-\infty}^{\infty} d\omega' F(\omega)F^*(\omega')e^{-i\omega\tau}\delta(\omega'-\omega) \qquad (5)$$

Using the indicated delta function over $\omega'$ yields $$A(\tau) = 2\pi \int_{-\infty}^{\infty} d\omega F(\omega) F^*(\omega)e^{-i\omega\tau} = \int_{-\infty}^{\infty} d\omega |F(\omega)|^2 e^{-i\omega\tau} \qquad (6)$$

In the special case where $$|F(\omega)|^2 = C \qquad (7)$$

where C is a constant, (6) becomes $$A(\tau) = 2\pi C \int_{-\infty}^{\infty} d\omega e^{-i\omega\tau} \qquad (8)$$

Using (4) from above, (8) can be written as $$A(\tau) = (2\pi)^2 C\delta(\tau) \qquad (9)$$

which is a delta function located at the origin. Hence, the autocorrelation function of a time sequence $f(t)$ is a delta function if the Fourier spectrum $F(\omega)$ of the time sequence has a constant modulus for all $\omega$. This is the only restriction on $F(\omega)$, the phase may be entirely random. Because of the sifting property of the delta function, it is expected that $A(\tau)$ $(2\pi)^2$ C at the origin, and $A(\tau)=0$ otherwise. There are no restrictions on the phases of the various frequencies in the frequency space, however, the auto-correlation and cross-correlation properties between different sequences can be optimized by choosing appropriate random sequences for the phases for each set of frequencies.

In the simplest case, both the real (I) and imaginary (Q) amplitudes of the complex frequency space are selected from different pseudo-random sequences consisting of a random selection of 1 or −1 for each I and Q value. This is done for each desired sequence. Sequences generated in this manner have excellent auto-correlation and cross-correlation properties.

Figure 5:
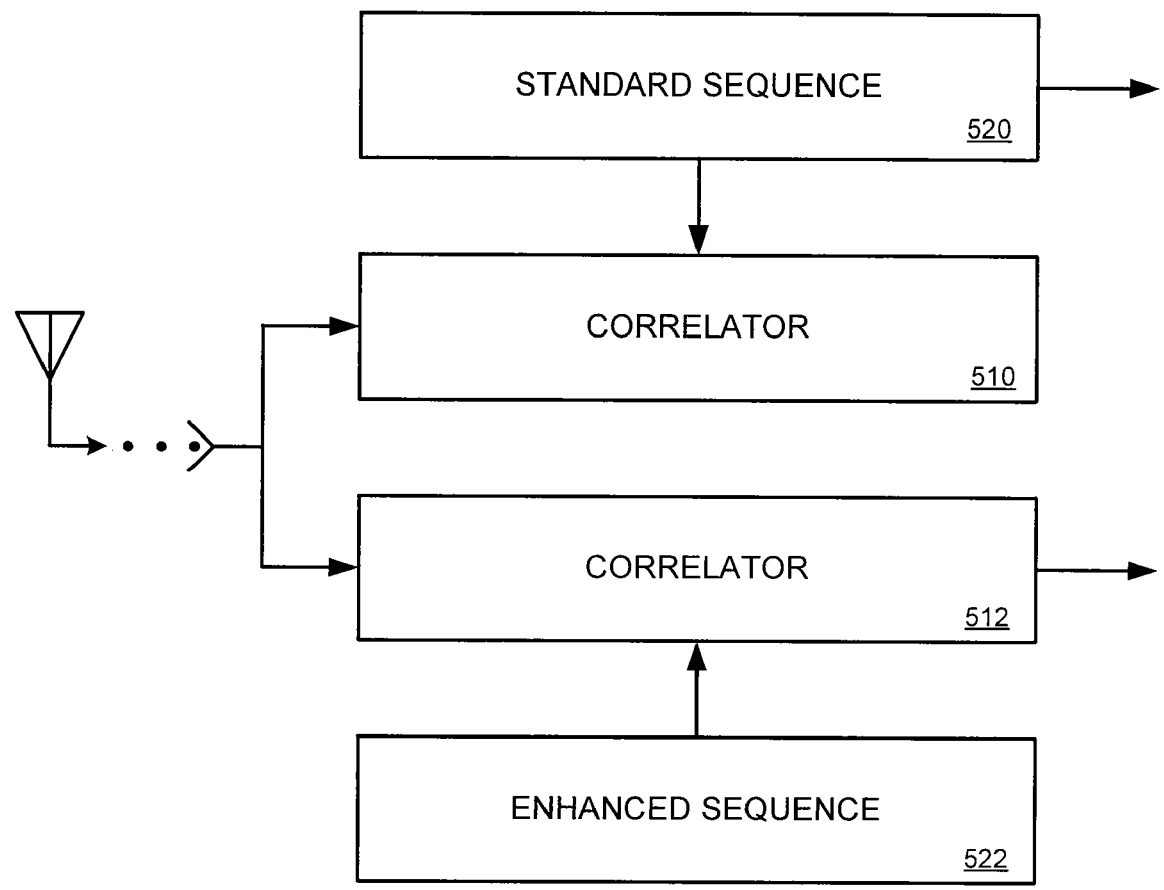
FIG. 5 illustrates is a block diagram of the components of an example embodiment of the present invention using two correlators.

In the case where a standard communication protocol employs such a sequence as in the 802.11a OFDM standard (i.e. the long synchronization symbol), it is possible to use two different correlators 510, 512 (see e.g. FIG. 5), each capable of detecting a unique sequence to identify communications with a standard node or an enhanced node. In operation, one correlator 510 would detect the standard sequence 520 and the other correlator 512 would detect the sequence 522 for the enhanced node. During reception of a packet, the appropriate correlator would indicate a peak permitting the receiving station to determine what kind of node the packet originated. Identification of the node type occurs during synchronization, permitting a receiver to turn on various enhancements based on the type of node sending the signal.

In the case where the standard communication does not employ such a sequence as in the 802.11b standard, it is possible to pre-append the sequence to the beginning of the standard synchronization sequence. This will incur extra time to synchronize, but in the case of 802.11b the extra time should be accommodated. Another method would be to replace the start frame delimiter (SFD) in the 802.11b preamble with the sequence. This method would not cause any additional delays.

Although the above examples are wireless communication standards, those skilled in the art will recognize that the method of the present invention could also be used with non-wireless standards as well.

Referring now to FIG. 1, there is shown a block diagram for an apparatus for carrying out the method of the present invention. A receiving node, generally designated 100 receives an OFDM modulated signal from a source via antenna 102. The signal passed through tuner 104 which converts the signal into an intermediate frequency (IF) signal. The OFDM modulated wave is, for instance, a QAM signal which was OFDM modulated by a specific frequency, and transmitted. The QAM signal is able to express symbols using I-data corresponding to the real part of complex form signals and Q-data corresponding to the imaginary part of the complex form signal. The IF signal is applied to a band pass filter 106, which removes noise outside the passing band and outputs the IF signal to multipliers 108, 110.

An oscillator 112 outputs oscillation output to multiplier 110 and, to multiplier 108 via a phase shifter 114. The phase shifter 114 obtains a Q-axis oscillation output by shifting oscillation output (I-axis oscillation output) by 90.degrees. The multipliers 108, 110 perform the orthogonal detection by multiplying the I-axis or Q-axis oscillation output with the IF signal, respectively. The in-phase axis detection output (I-signal) from the multiplier 110 is applied to an analog/digital converter (hereinafter referred to as A/D converter) 122 via a low-pass filter (hereinafter referred to as LPF) 120. The orthogonal axis detection output (Q-signal) from the multiplier 108 is applied to another A/D converter 118 via an LPF 116. LPFs 120, 116 remove harmonic wave components of I-signal or Q-signal, respectively. The A/D converters 118, 122 are supplied with an operating clock from an oscillator (not shown). A/D converters 118, 122, convert signals which are input into discrete values at a sampling interval based on the operating clock, and output them to a shift register 124. The shift register would be capable of holding several discrete values in a plurality of memory cells 126. As a new discrete value is shifted from A/D's 118, 122 into shift register 124, the discrete values already stored in the memory cells 126 of shift register 124 are shifted to the adjacent memory cell 126. The shift register 124 would be supplied with an operating clock from an oscillator (not shown) to synchronize the shifts with the input of new discrete values from A/D's 118, 122. The data stored in the shift registers are then cross-correlated with a known sequence stored in memory location 128. The method shown in FIG. 1 shows the data in the shift register 124 is multiplied with the data stored in memory location 128 by a plurality of multipliers 130. However, there are numerous other methods and combinations of gates that are well known in the art may be used to obtain the cross-correlation. The outputs of the plurality of multipliers 130 are sent to a summer 132. The summer 132 has an output 134 which indicates whether a correlation was found. While the above example was given with respect to QAM modulation, those skilled in the art can appreciate that other modulation methods such as BPSK are also capable of being used with the present invention.

Figure 2:
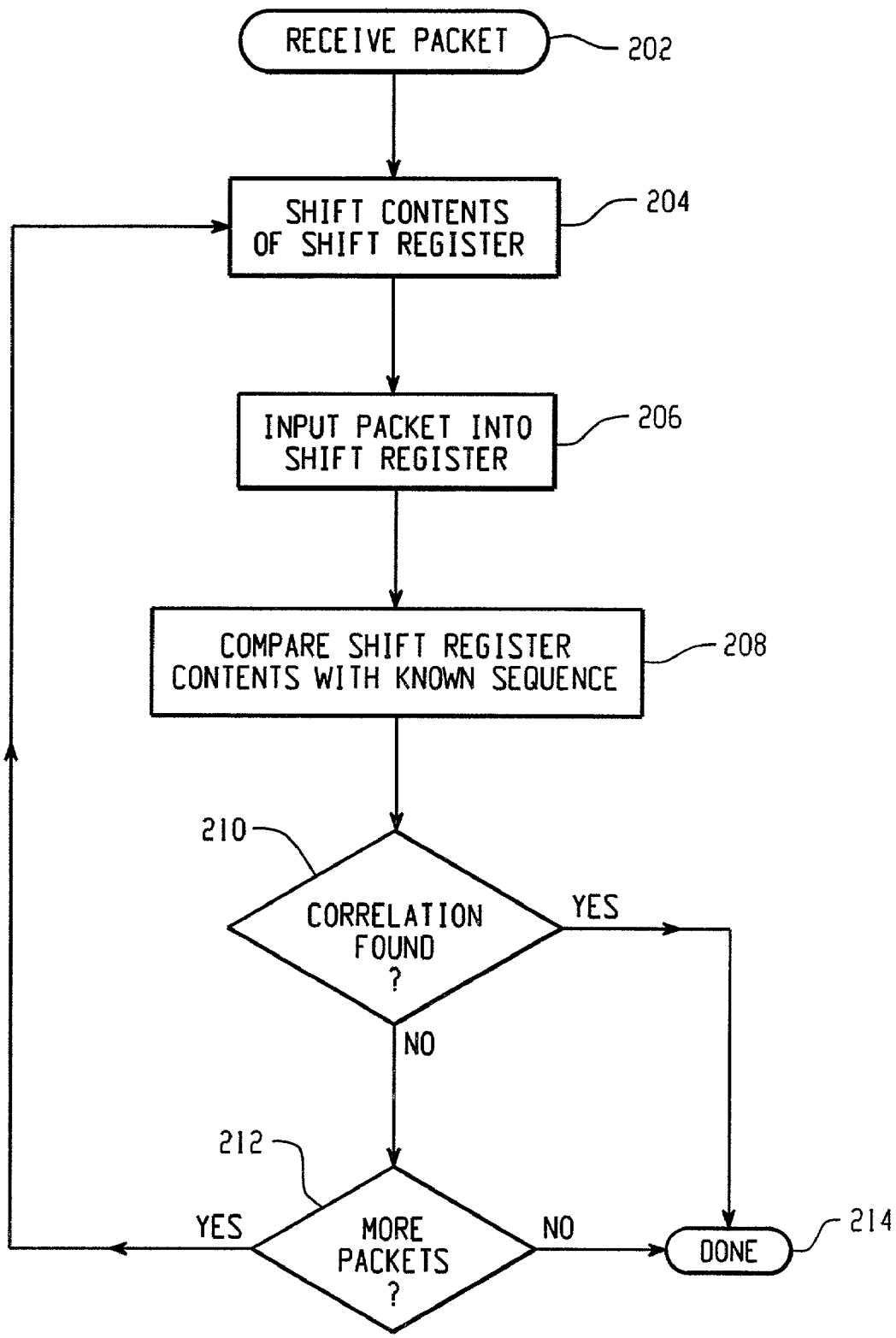
FIG. 2 is a block diagram showing the steps used by the method of the present invention.

Referring now to FIG. 2, a packet is received by the receiver 100 as shown in step 202. The shift register contents are then shifted as shown in step 204. In step 206 the next packet is input into the shift register. Steps 204 and 206 may either be performed simultaneously or in the sequence as just described. In step 208 the contents of the shift register are correlated with a known sequence stored in memory. The preferred method of correlation is to perform a packet-by-packet multiplication of the contents of the shift register with the known sequence, and then sum the products, however, those skilled in the art will readily appreciate that there are an almost infinite number of available methods for comparing digital packets.

Step 210 is an optional step. Step 210 is showing that if a correlation is found then the process may stop. However, this may not always be desirable. Some applications of the present invention may involve multiple correlators which may be connected in parallel. These other correlators may be looking for a different sequence, thus it may be necessary to continue processing packets even after a correlation has been found. For example, one correlator (i.g 510 FIG. 5) may be used to determine if the signal source supports enhanced QoS while a second correlator (e.g., 512 FIG. 5) may be used to detect if the signal source supports advanced synchronization, and yet a third correlator may be necessary to determine if the signal source supports enhanced power saving features, etc. A peak hold circuit 136 (FIG. 1) or other means such as a flip flop receiving its set input from output 134 may be used to indicate a correlation was found during the process.

If, at step 212 there are more packets to process, then processing reverts back to step 204. If there are no more packets, then the process stops as shown in step 214.

Figure 3:
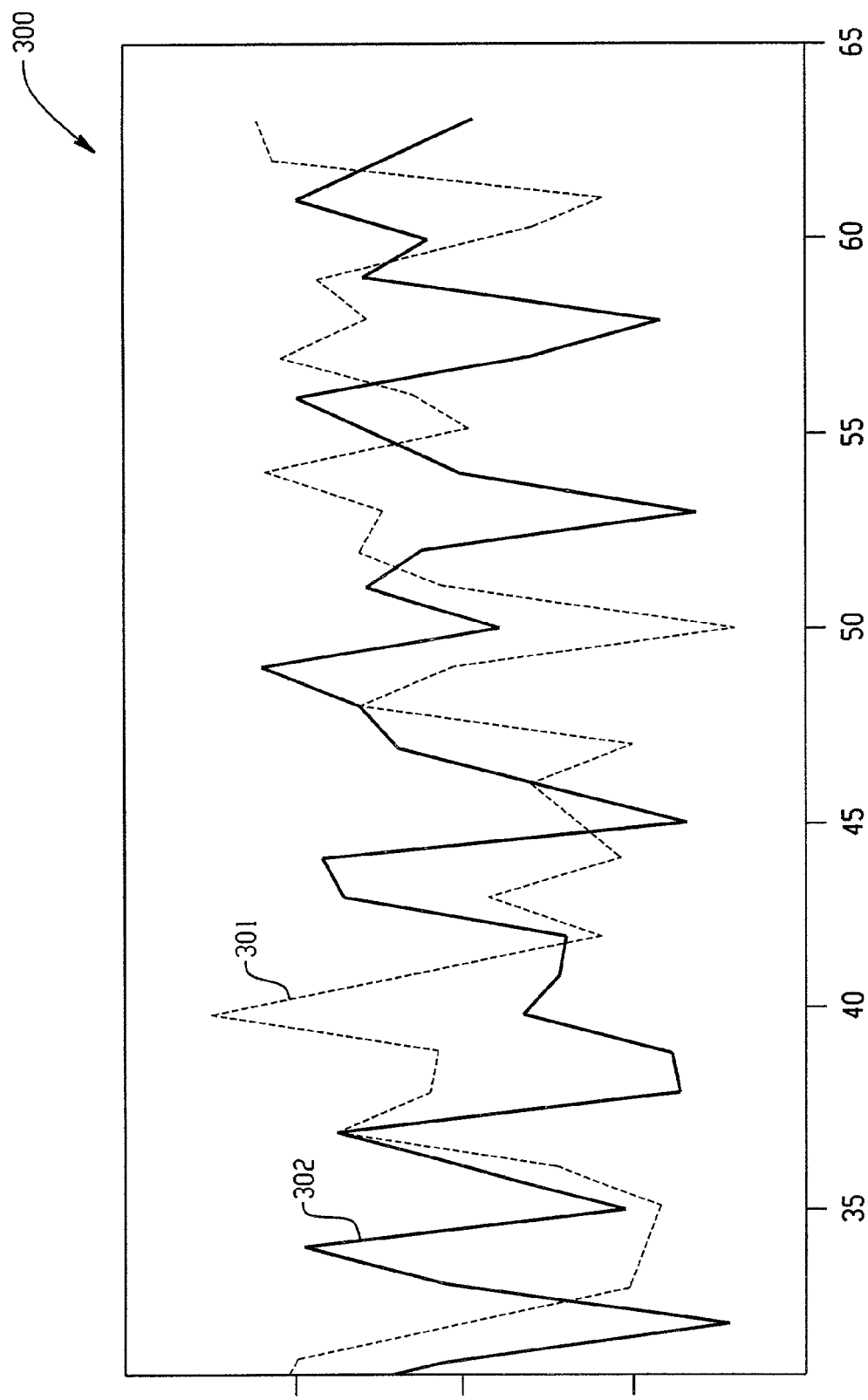
FIG. 3 is a simulated signal being received showing a real time waveform in the time domain of the signal.

Referring now to FIG. 3 there is shown a real time waveform as seen by the receiver. Waveform 301 represents the real part of the waveform and waveform 302 represents the imaginary part of the waveform.

Figure 4:
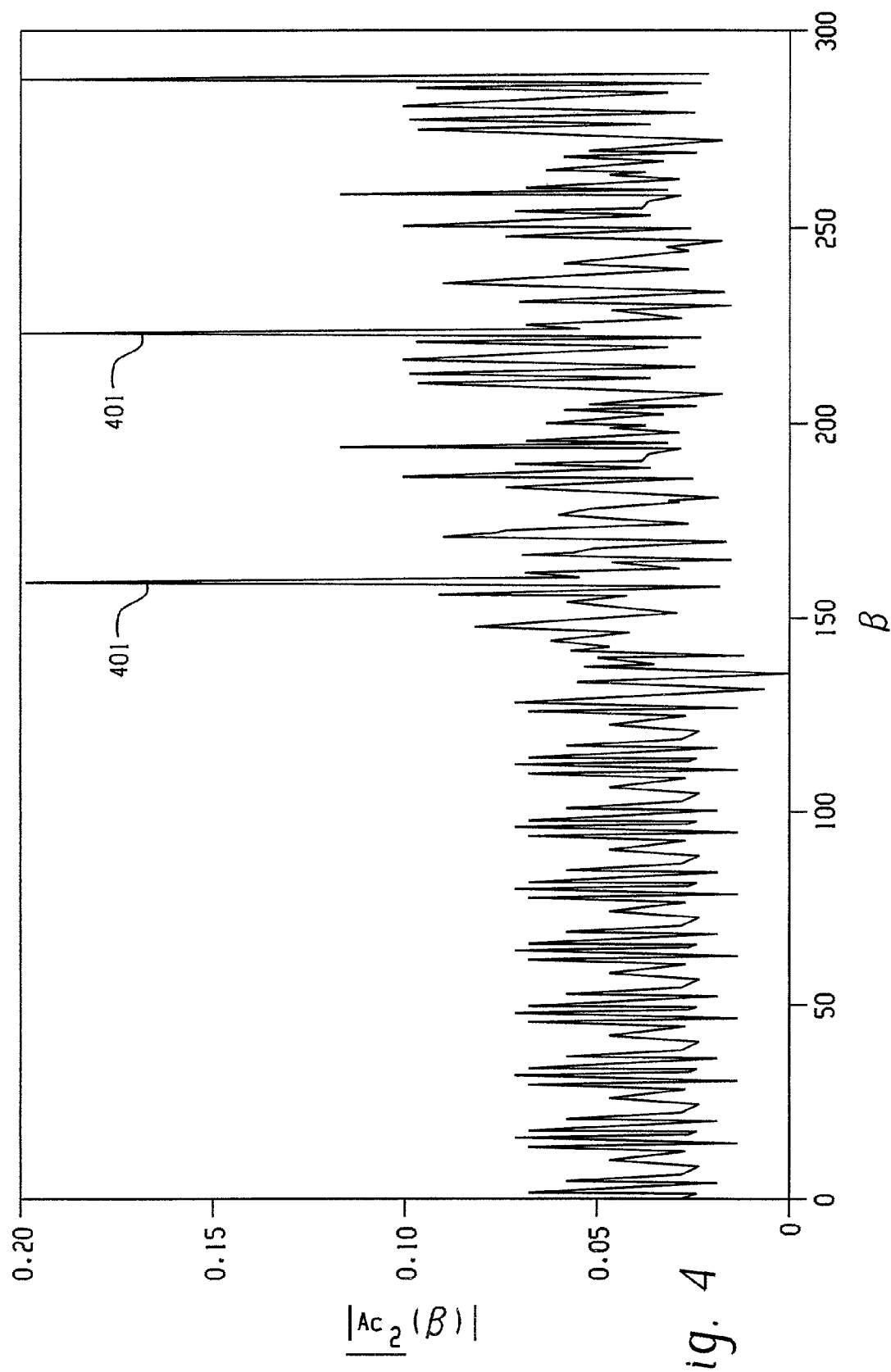
FIG. 4 is a simulated output of the apparatus of the present invention.

FIG. 4 represents the correlation of the signal as it is processed by the method of the present invention. Peaks 401 indicate when a correlation was found. As expected, the output of the correlator is low otherwise.

Although the invention has been shown and described with respect to a certain preferred embodiment, it is obvious that equivalent alterations and modifications will occur to others skilled in the art upon the reading and understanding of this specification. The present invention includes all such equivalent alterations and modifications and is limited only by the scope of the following claims.

The invention claimed is:

1. An apparatus, comprising:
    a first memory containing a first known pseudorandom sequence;
    a second memory containing a second known pseudorandom sequence;
    a third memory containing a third known pseudorandom sequence a receiver for receiving a signal;
    an analog to digital converter receiving the signal from the receiver and operable to convert the signal to a digital packet having a synchronization preamble;
    a first correlator comprising a shift register configured receiving the output from the analog to digital converter and storing the output as a plurality of discrete values, and a plurality of multipliers where each multiplier receives one input from the shift register and a second input from the first memory for receiving a corresponding portion of the first known pseudorandom sequence, the first correlator further comprising a summing circuit coupled to outputs of the plurality of multipliers, the summing circuit producing an output indicating whether a correlation was found between the first known pseudorandom sequence and contents of the shift register; and
    a second correlator comprising a shift register configured for receiving the output from the analog to digital converter and storing the output as a plurality of discrete values, and a plurality of multipliers, where each multiplier receives one input from the shift register and a second input from the second memory for receiving a corresponding portion of the second known pseudorandom sequence, the second correlator further comprising a summing circuit coupled to outputs of the plurality of multipliers, the summing circuit producing an output indicating whether a correlation was found between the second known pseudorandom sequence and contents of the shift register;
    a third correlator comprising a shift register configured for receiving the output from the analog to digital converter and storing the output as a plurality of discrete values, and a plurality of multipliers, where each multiplier receives one input from the shift register and a second input from the second memory for receiving a corresponding portion of the third known pseudorandom sequence, the third correlator further comprising a summing circuit coupled to outputs of the plurality of multipliers, the summing circuit producing an output indicating whether a correlation was found between the first known sequence and contents of the shift register;
    wherein the type of node sending the signal is determined to support enhanced Quality of Service (QoS) responsive to the first correlator finding a correlation within the synchronization preamble and the first known pseudorandom sequence while performing packet synchronization;
    wherein the type of node sending the signal is determined to support enhanced synchronization responsive to the second correlator finding a correlation with the second known pseudorandom sequence within the synchronization preamble while performing packet synchronization; and
    wherein the type of node sending the signal is determined to support enhanced power savings responsive to the third correlator finding a correlation with the third known pseudorandom sequence within the synchronization preamble while performing synchronization.

2. The apparatus for determining whether a signal is from an enhanced node as in claim 1, further comprising:
a first peak and hold circuit coupled to the first correlator; and
a second peak and hold circuit coupled to the second correlator.

3. The apparatus for determining whether a signal is from an enhanced node as in claim 1, wherein the first and second correlators are parallel to each other.

4. The apparatus for determining whether a signal is from an enhanced mode as in claim 1, wherein the first memory and second memory are different locations within a single memory.

5. An apparatus, comprising:
a receiver for receiving a signal;
an analog to digital converter coupled to the receiver to receive the signal from the receiver and convert the signal to a digital packet having a synchronization preamble, a payload and data pre-appended to the synchronization preamble;
a first memory containing a first known predefined pseudorandom sequence;
a second memory containing a second known predefined pseudorandom sequence;
a third memory containing a third known predefined pseudorandom sequence;
a first correlator comprising a shift register configured to receive the data packet from the analog to digital converter and storing the output as a plurality of discrete values, and a plurality of multipliers where each multiplier receives one input from the shift register and a second input from the first memory for receiving a corresponding portion of the first known pseudorandom sequence, the first correlator further comprising a summing circuit coupled to the outputs of the plurality of multipliers, the summing circuit producing an output indicating whether a correlation was found between the first known pseudorandom sequence and contents of the shift register;
a second correlator comprising a shift register configured for receiving the output from the analog to digital converter and storing the output as a plurality of discrete values, and a plurality of multipliers, where each multiplier receives one input from the shift register and a second input from the second memory for receiving a corresponding portion of the second known pseudorandom sequence, the second correlator further comprising a summing circuit coupled to outputs of the plurality of multipliers, the summing circuit producing an output indicating whether a correlation was found between the second known pseudorandom sequence and contents of the shift register;
a third correlator comprising a shift register configured for receiving the output from the analog to digital converter and storing the output as a plurality of discrete values, and a plurality of multipliers, where each multiplier receives one input from the shift register and a second input from the second memory for receiving a corresponding portion of the third known pseudorandom sequence, the third correlator further comprising a summing circuit coupled to outputs of the plurality of multipliers, the summing circuit producing an output indicating whether a correlation was found between the first known sequence and contents of the shift register;

wherein the type of node sending the signal is determined to support enhanced Quality of Service (QoS) responsive to the first correlator finding a correlation with the data pre-appended to the data packet and the first predefined pseudorandom while performing packet synchronization, wherein the type of node sending the signal is determined to support enhanced synchronization responsive to the second correlator finding a correlation with the second known pseudorandom sequence within the data pre-appended to the synchronization preamble while performing packet synchronization; and wherein the type of node sending the signal is determined to support enhanced power savings responsive to the third correlator finding a correlation with the third known pseudorandom sequence within the data pre-appended to the synchronization preamble while performing synchronization.

6. The apparatus of claim 5, further comprising a peak and hold circuit coupled to the first correlator.

7. The apparatus of claim 5, further comprising:
a first peak and hold circuit coupled to the first correlator; and
a second peak and hold circuit coupled to the second correlator.

8. The of claim 5, wherein the first and second correlators are parallel to each other.

9. The apparatus of claim 5, wherein the first memory and second memory are different locations within a single memory.

10. An apparatus, comprising:
a receiver for receiving a signal;
an analog to digital converter coupled to the receiver to receive the signal from the receiver and convert the signal to a digital packet having a synchronization preamble, a start frame delimiter and a payload;
a first memory containing a first predefined pseudorandom sequence;
a second memory containing a second known predefined pseudorandom sequence;
a third memory containing a third known predefined pseudorandom sequence;
a first correlator comprising a shift register configured to receive the data packet from the analog to digital converter and storing the output as a plurality of discrete values, and a plurality of multipliers where each multiplier receives one input from the shift register and a second input from the first memory, the first correlator further comprising a summing circuit coupled to the outputs of the plurality of multipliers, the summing circuit producing an output indicating whether a correlation was found between the first known predefined pseudorandom sequence and contents of the shift register;
a second correlator comprising a shift register configured for receiving the output from the analog to digital converter and storing the output as a plurality of discrete values, and a plurality of multipliers, where each multiplier receives one input from the shift register and a second input from the second memory for receiving a corresponding portion of the second known pseudorandom sequence, the second correlator further comprising a summing circuit coupled to outputs of the plurality of multipliers, the summing circuit producing an output indicating whether a correlation was found between the second known pseudorandom sequence and contents of the shift register;

a third correlator comprising a shift register configured for receiving the output from the analog to digital converter and storing the output as a plurality of discrete values, and a plurality of multipliers, where each multiplier receives one input from the shift register and a second input from the second memory for receiving a corresponding portion of the third known pseudorandom sequence, the third correlator further comprising a summing circuit coupled to outputs of the plurality of multipliers, the summing circuit producing an output indicating whether a correlation was found between the first known sequence and contents of the shift register;

wherein the type of node sending the signal is determined to support enhanced Quality of Service (QoS) responsive to the first correlator finding a correlation with the start frame delimiter and the first predefined pseudorandom sequence;

wherein the type of node sending the signal is determined to support enhanced synchronization responsive to the second correlator finding a correlation with the second known pseudorandom sequence within the start frame delimiter while performing packet synchronization; and wherein the type of node sending the signal is determined to support enhanced power savings responsive to the third correlator finding a correlation with the third known pseudorandom sequence within the start frame delimiter while performing synchronization.

11. The apparatus of claim 10, further comprising a peak and hold circuit coupled to the first correlator.

12. The apparatus of claim 10, further comprising:
a first peak and hold circuit coupled to the first correlator; and
a second peak and hold circuit coupled to the second correlator.

13. The of claim 10, wherein the first and second correlators are parallel to each other.

14. The apparatus of claim 10, wherein the first memory and second memory are different locations within a single memory.

* * * * *